(12) United States Patent
Sel et al.

(10) Patent No.: US 7,816,245 B2
(45) Date of Patent: Oct. 19, 2010

(54) METHOD OF FORMING SEMICONDUCTOR DEVICES IN WHICH A CELL GATE PATTERN AND A RESISTOR PATTERN ARE FORMED OF A SAME MATERIAL

(75) Inventors: Jong-Sun Sel, Gyeonggi-do (KR); Jung-Dal Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 267 days.

(21) Appl. No.: 11/648,992

(22) Filed: Jan. 3, 2007

(65) Prior Publication Data

US 2008/0079028 A1  Apr. 3, 2008

(30) Foreign Application Priority Data

Sep. 29, 2006  (KR) ............... 10-2006-0095909

(51) Int. Cl.
*H01L 21/3205* (2006.01)
(52) U.S. Cl. .............. 438/593; 257/211; 257/E29.17; 257/E21.209
(58) Field of Classification Search ......... 257/211, 257/E29.17, E21.209; 438/593
See application file for complete search history.

(56) References Cited

U.S. PATENT DOCUMENTS

| | | | |
|---|---|---|---|
| 6,228,714 B1 * | 5/2001 | Choi ..................... | 438/258 |
| 6,737,322 B2 | 5/2004 | Inoue et al. | |
| 7,011,999 B2 | 3/2006 | Minami et al. | |
| 2004/0175932 A1 * | 9/2004 | Kim et al. ............... | 438/637 |
| 2005/0048718 A1 * | 3/2005 | Ahn et al. ............... | 438/257 |
| 2005/0184330 A1 * | 8/2005 | Ding ........................ | 257/314 |

FOREIGN PATENT DOCUMENTS

| | | |
|---|---|---|
| JP | 2003-258134 | 3/2002 |
| JP | 2004-200504 | 7/2004 |
| KR | 10-2000-0035157 A | 6/2000 |
| KR | 10-2002-0073959 A | 9/2002 |
| KR | 10-2003-0076443 A | 9/2003 |
| KR | 10-2004-0054575 | 6/2004 |
| KR | 10-2004-0054575 A | 6/2004 |
| KR | 10-2006-0024998 | 3/2006 |

* cited by examiner

*Primary Examiner*—Thao X Le
*Assistant Examiner*—Matthew Gordon
(74) *Attorney, Agent, or Firm*—Myers Bigel Sibley & Sajovec, P.A.

(57) ABSTRACT

A semiconductor device is formed by providing a semiconductor substrate comprising a cell region, a peripheral circuit region, and a resistor region, forming a device isolation layer on the semiconductor substrate so as to define an active region, forming a first insulating layer and a polysilicon pattern on the active region of the peripheral circuit region, forming a second insulating layer, a charge storage layer, and a third insulating layer on the active region of the cell region, forming a conductive layer on the semiconductor substrate, and patterning the conductive layer to form conductive patterns on the third insulating layer of the cell region, the polysilicon pattern of the active region of peripheral circuit region, and the semiconductor substrate of the resistor region, respectively.

6 Claims, 7 Drawing Sheets

Fig. 4
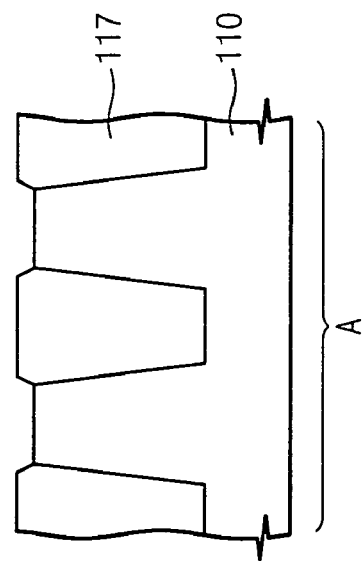
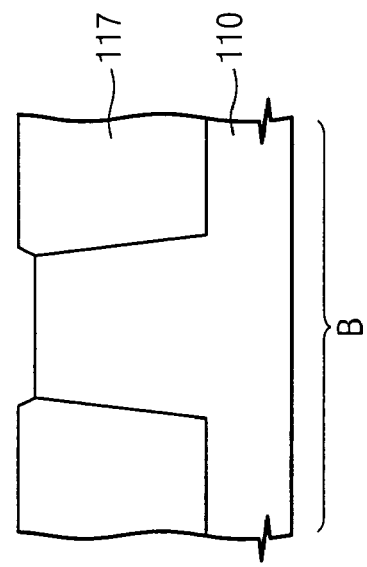
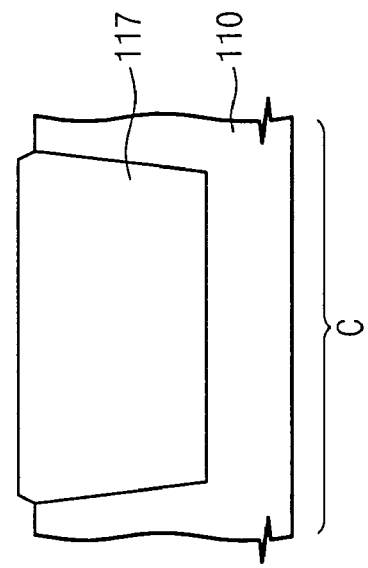

Fig. 5
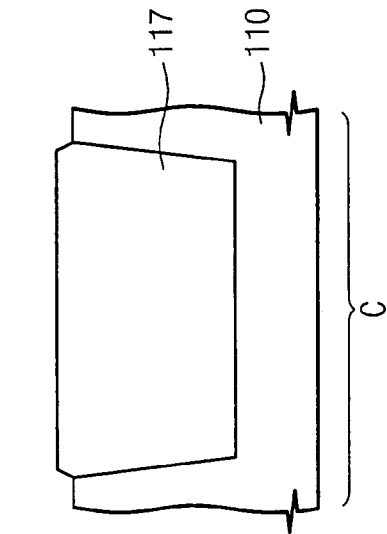
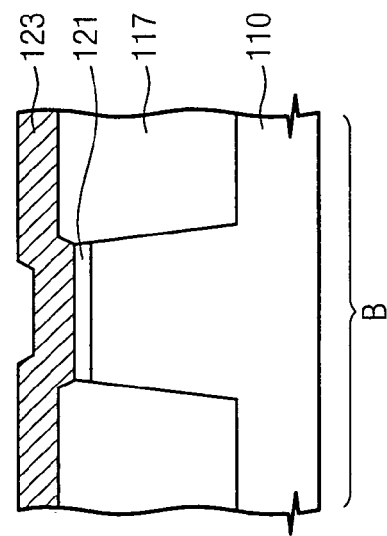
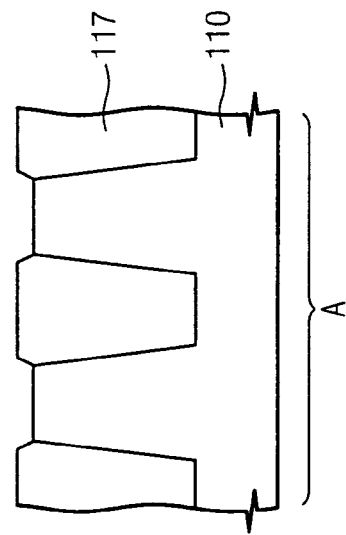

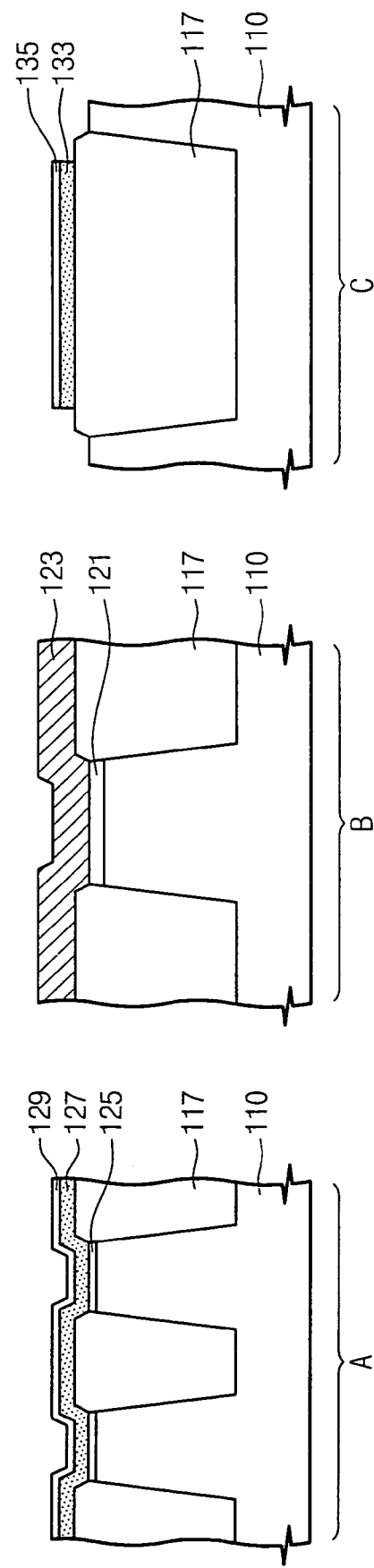

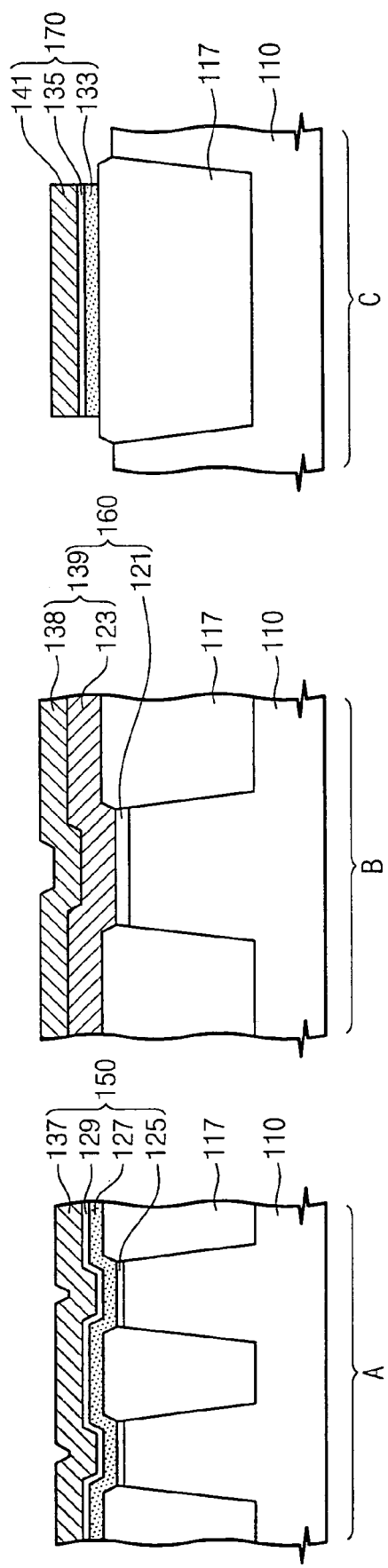

METHOD OF FORMING SEMICONDUCTOR DEVICES IN WHICH A CELL GATE PATTERN AND A RESISTOR PATTERN ARE FORMED OF A SAME MATERIAL

CROSS-REFERENCE TO RELATED APPLICATION

This U.S. non-provisional patent application claims priority under 35 U.S.C. §119 to Korean Patent Application No. 2006-95909, filed on Sept. 29, 2006, the entire contents of which are hereby incorporated by reference.

BACKGROUND OF THE INVENTION

The present invention disclosed herein relates to semiconductor devices, and more particularly, to semiconductor devices having a resistor.

A flash memory device, which is a type of nonvolatile memory device, may be classified into a floating gate type and a charge trap type according to a kind of a data storage layer of a unit cell. A MONOS (metal/oxide/nitride/oxide/silicon) flash memory device, which is a charge trap type flash memory device, includes a cell transistor of which a gate structure is configured with a tunneling insulating layer, a charge storage layer, a blocking insulating layer, and a metal gate electrode.

The MONOS flash memory device includes a passive element, such as resistor, as well as an active element, such as a transistor. The resistor used in a reference circuit or the like in a conventional MONOS flash memory device typically has a small area, and the resistor is typically fabricated using polysilicon with high resistance, which may be insensitive to process variations. Thus, to reduce fabrication cost and increase productivity, it may be desirable to form the resistor at the same time when other elements are formed in a semiconductor device.

SUMMARY OF THE INVENTION

A semiconductor device, according to some embodiments of the present invention, is formed by providing a semiconductor substrate comprising a cell region, a peripheral circuit region, and a resistor region, forming a device isolation layer on the semiconductor substrate so as to define an active region, forming a first insulating layer and a polysilicon pattern on the active region of the peripheral circuit region, forming a second insulating layer, a charge storage layer, and a third insulating layer on the active region of the cell region, forming a conductive layer on the semiconductor substrate, and patterning the conductive layer to form conductive patterns on the third insulating layer of the cell region, the polysilicon pattern of the active region of peripheral circuit region, and the semiconductor substrate of the resistor region, respectively.

In other embodiments, the method further includes forming a fourth insulating layer and a fifth insulating layer on the semiconductor substrate of the resistor region before the forming the conductive layer. The fourth and fifth insulating layers are formed of the same materials as the charge storage layer and the third insulating layer, respectively.

In still other embodiments, forming the conductive layer includes forming a first metal layer in contact with the third and fifth insulating layers.

In still further embodiments, forming the conductive layer further includes forming at least one layer on the first metal layer that includes a polysilicon layer and/or a second metal layer.

In still other embodiments, the first metal layer includes tantalum nitride (TaN), and the second metal layer includes tungsten nitride (WN) and/or tungsten (W).

In further embodiments of the present invention, a semiconductor device includes a semiconductor substrate including a cell region, a peripheral circuit region, and a resistor region. A cell gate structure is disposed in the cell region, including a first insulating layer, a charge storage layer, a second insulating layer, and a cell gate pattern stacked sequentially. A peripheral circuit gate structure is disposed in the peripheral circuit region, including a third insulating layer and a peripheral circuit gate pattern stacked sequentially. A resistor structure is disposed in the resistor region, including a resistor pattern. The cell gate pattern and the resistor pattern include a same material.

In still further embodiments, the cell gate pattern and the resistor pattern include a first metal pattern in contact with underlying layers thereof.

In still further embodiments, the peripheral circuit gate pattern includes a first polysilicon pattern in contact with the third insulating layer.

In still further embodiments, the cell gate pattern and the resistor pattern further include at least one pattern including a second polysilicon pattern and/or a second metal pattern. The at least one pattern is disposed on the first metal pattern.

In still further embodiments, the peripheral circuit gate pattern further includes a conductive pattern on the first polysilicon pattern. The conductive pattern has a same structure as the cell gate pattern and the resistor pattern.

In still further embodiments, the resistor structure further includes fourth and fifth insulating layers between the semiconductor substrate and the resistor pattern. The fourth and fifth insulating layers including same materials as the charge storage layer and the second insulating layer, respectively.

BRIEF DESCRIPTION OF THE DRAWINGS

Other features of the present invention will be more readily understood from the following detailed description of exemplary embodiments thereof when read in conjunction with the accompanying drawings, in which:

FIGS. 2 through 7 are cross-sectional views illustrating methods of forming a semiconductor device according to some embodiments of the present invention.

DETAILED DESCRIPTION

Figure 1:
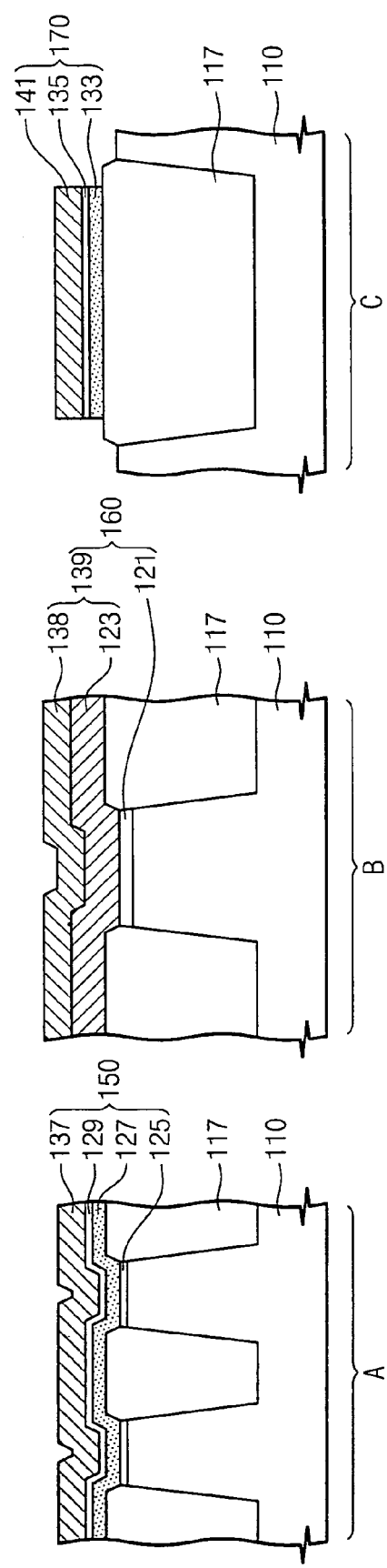
FIG. 1 is a cross-sectional view of a semiconductor device according to some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

FIG. 1 is a sectional view of a semiconductor device according to some embodiments of the present invention. Referring to FIG. 1, a device isolation layer 117 is disposed on a semiconductor substrate 110 including a cell region A, a peripheral circuit region B, and a resistor region C, thereby defining an active region.

In the cell region A, a cell gate structure 150 is disposed on the active region. The cell gate structure 150 includes a first insulating layer 125, a charge storage layer 127, a second insulating layer 129, and a cell gate pattern 137. The first insulating layer 125 may be a thermal oxide layer, and may be called a tunneling insulating layer. The charge storage layer 127, in which charges can be trapped, may include a nitride layer, for example. The second insulating layer 129 may include a silicon oxide ($SiO_2$) layer and/or an aluminum oxide ($Al_2O_3$) layer, and may be called a blocking insulating layer. The second insulating layer 129 may play a role in preventing charges trapped in the charge storage layer 127 from being discharged into the overlying cell gate pattern 137. The cell gate pattern 137 may include a metal pattern in contact with the second insulating layer 129. In addition, the cell gate pattern 137 may be configured as a multi-stacked structure including, for example, a tantalum nitride (TaN) pattern/tungsten (W) pattern, a tantalum nitride (TaN) pattern/polysilicon pattern, a tantalum nitride (TaN) pattern/tungsten nitride (WN) pattern/tungsten (W) pattern, a tantalum nitride (TaN) pattern/polysilicon pattern/tungsten nitride (WN) pattern/tungsten (W) pattern, or the like.

In the peripheral circuit region B, a peripheral circuit gate structure 160 is disposed on the active region. The peripheral circuit gate structure 160 includes a third insulating layer 121 and a peripheral circuit gate pattern 139. The peripheral circuit gate pattern 139 includes a polysilicon pattern 123 and a conductive pattern 138. The third insulating layer 121, for example, may be a thermal oxide layer, and may be called a gate insulating layer. Because the peripheral region B includes a low-voltage region and a high-voltage region, the third insulating layer 121 may have various thicknesses according to the characteristic of the region where the third insulating layer 121 is disposed. The polysilicon pattern 123 is disposed on the third insulating layer 121. The conductive pattern 138 is disposed on the polysilicon pattern 123. The conductive pattern 138 may have the same material and configuration as the cell gate pattern 137 of the cell region A. That is, the conductive pattern 138 may be configured as a multi-stacked structure including, for example, a tantalum nitride (TaN) pattern/tungsten (W) pattern, a tantalum nitride (TaN) pattern/polysilicon pattern, a tantalum nitride (TaN) pattern/tungsten nitride (WN) pattern/tungsten (W) pattern, a tantalum nitride (TaN) pattern/polysilicon pattern/tungsten nitride (WN) pattern/tungsten (W) pattern, or the like.

In the resistor region C, a resistor structure 170 is disposed on the device isolation layer 117. The resistor structure 170 may act as a resistor. The resistor structure 170 includes a fourth insulating layer 133, a fifth insulating layer 135, and a resistor pattern 141. The fourth insulating layer 133, the fifth insulating layer 135 and the resistor pattern 141 may be formed of the same material as the charge storage layer 127, the second insulating layer 129, and the cell gate pattern 137 in cell region A, respectively. That is, the fourth insulating layer 133 may include a nitride layer, and the fifth insulating layer 135 may include a silicon oxide layer and/or an aluminum oxide layer. Furthermore, the resistor pattern 141 may be configured as a multi-stacked structure, including, for example, a tantalum nitride (TaN) pattern/tungsten (W) pattern, a tantalum nitride (TaN) pattern/polysilicon pattern, a tantalum nitride (TaN) pattern/tungsten nitride (WN) pattern/tungsten (W) pattern, a tantalum nitride (TaN) pattern/polysilicon pattern/tungsten nitride (WN) pattern/tungsten (W) pattern, or the like.

FIGS. 2 through 7 are sectional views illustrating methods of forming a semiconductor device according to some embodiments of the present invention.

Figure 2:
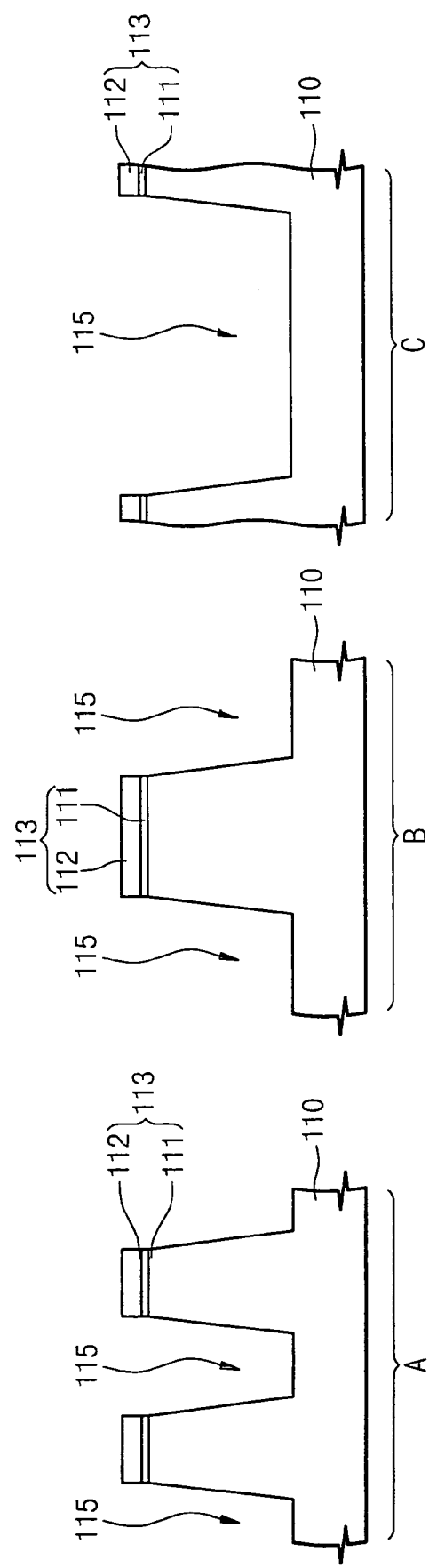
Figure 3:
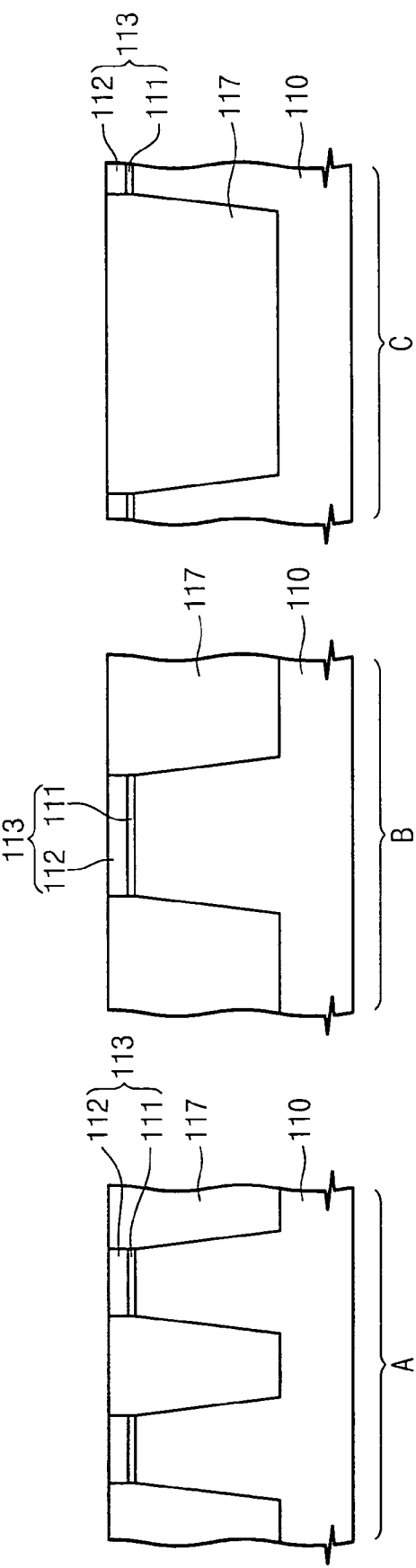

Referring to FIGS. 2 and 3, a semiconductor substrate 110 includes a cell region A, a peripheral circuit region B, and a resistor region C. A mask pattern 113 is formed on the semiconductor substrate 110. The mask pattern 113 may include an oxide pattern 111 and a nitride pattern 112. The oxide pattern 111 may play a role in relieving the stress that may occur between the semiconductor substrate 110 and the nitride pattern 112. The semiconductor substrate 110 is etched using the mask pattern 113 as an etch mask so as to form a trench 115. The portion of the semiconductor substrate 110 that is not etched between the trenches 115 may be defined as an active region.

Thereafter, the trench 115 is filled with an insulating layer and the insulating layer is then planarized, thereby exposing a top surface of the mask pattern 113 and forming a device isolation layer 117. Before forming the insulating layer, an annealing process may be performed for repairing etch damage that may occur during the etching process. In addition, a nitride liner may be formed on inside walls of the trench 115.

Referring to FIGS. 4 and 5, the mask pattern 113 is removed so that the active region between the device isolation layers 117 is exposed. When the mask pattern 113 is removed, the device isolation layer 117 may be partially removed also so that the top surface thereof may be somewhat recessed. Alternatively, a process for rounding edges of the top surface of the device isolation layer 117 may be performed.

Subsequently, the third insulating layer 121 and the polysilicon pattern 123 are formed on the exposed active region of the peripheral circuit region B. The third insulating layer 121, for example, may be formed by performing a thermal oxidation process on the exposed active region. The polysilicon pattern 123 may be formed by forming a polysilicon layer through a chemical vapor deposition (CVD) process and then patterning the polysilicon layer.

Referring to FIG. 6, a first insulating layer 125 is formed on the exposed active region of the cell region A. The first insulating layer 125 may be formed by performing a thermal oxidation process on the exposed active region.

Thereafter, a charge storage layer 127 and a second insulating layer 129 are formed on the first insulating layer 125. At the same time, a fourth insulating layer 133 and a fifth insulating layer 135 are formed on the device isolation layer 117 of the resistor region C. Thus, the charge storage layer 127 may be formed of the same material as the fourth insulating layer 133, and the second insulating layer 129 may be formed of the same material as the fifth insulating layer 135. For example, the charge storage layer 127 and the fourth insulating layer 133 may be formed by forming a nitride layer on the semiconductor substrate where the first insulating layer 125 is formed and then patterning the nitride layer. In addition, by forming an insulating layer having a silicon oxide layer and/or an aluminum oxide layer on the semiconductor substrate where the charge storage layer 127 and the fourth insulating layer 133 are formed and subsequently patterning the insulating layer, the second insulating layer 129 and the fifth insulating layer 135 may be formed.

Referring to FIG. 7, a cell gate pattern 137, a conductive pattern 138 and a resistor pattern 141 are respectively formed on the second insulating layer 129 of the cell region A, the polysilicon pattern 123 of the peripheral circuit region B, and the fifth insulating layer 135 of the resistor region C. The cell gate pattern 137, the conductive pattern 138, and the resistor pattern 141 may be formed by forming a conductive layer on the entire surface of the semiconductor substrate and then patterning the conductive layer. Therefore, cell gate pattern 137, the conductive pattern 138, and the resistor pattern 141 may be formed of the same material. The forming of the conductive layer may include forming a first metal layer on the semiconductor substrate and forming one or more layers comprising a polysilicon layer and/or a second metal layer on the first metal layer. The first metal layer may include a tantalum nitride layer, and the second metal layer may include a tungsten nitride layer and/or a tungsten layer.

For example, the conductive layer may be configured as a multi-stacked structure including, for example, a tantalum nitride (TaN) pattern/tungsten (W) pattern, a tantalum nitride (TaN) pattern/polysilicon pattern, a tantalum nitride (TaN) pattern/tungsten nitride (WN) pattern/tungsten (W) pattern, a tantalum nitride (TaN) pattern/polysilicon pattern/tungsten nitride (WN) pattern/tungsten (W) pattern, or the like.

According to some embodiments, the cell gate structure 150 having the cell gate pattern 137 and the resistor structure 170 having the resistor pattern 141 may be simultaneously formed of the same material. Therefore, the process for forming the resistor structure 170 may be simplified. That is, the number of mask process and the number of masks used in the process may be reduced. Accordingly, it may be possible to improve productivity and reduce fabrication cost.

According to some embodiments of the present invention, it is possible to simplify the process of forming a semiconductor device having a resistor structure, which may improve productivity and reduce fabrication cost.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A method of forming a semiconductor device comprising:
   providing a semiconductor substrate comprising a cell region, a peripheral circuit region, and a resistor region;
   forming a first insulating layer and a polysilicon pattern on an active region of the peripheral circuit region;
   forming a second insulating layer, a charge storage layer, and a third insulating layer on the active region of the cell region;
   forming a conductive layer on the semiconductor substrate; and patterning the conductive layer to form conductive patterns on the third insulating layer of the cell region, the polysilicon pattern of the peripheral circuit region, and the semiconductor substrate of the resistor region, respectively;

wherein the cell region includes the active region defined by a device isolation layer, the peripheral circuit region includes an active region defined by the device isolation layer, and the resistor region includes the device isolation layer; and wherein the peripheral circuit region and the resistor region are spaced apart from the entire cell region, the cell region and the resistor region are spaced apart from the entire peripheral circuit region, and the cell region and the peripheral circuit region are spaced apart from the entire resistor region.

2. The method of claim 1, further comprising, before forming the conductive layer, forming a fourth insulating layer and a fifth insulating layer on the semiconductor substrate of the resistor region;

wherein the fourth and fifth insulating layers are formed of same materials as the charge storage layer and the third insulating layer, respectively.

3. The method of claim 2, wherein forming the conductive layer comprises forming a first metal layer in contact with the third and fifth insulating layers.

4. The method of claim 3, wherein forming the conductive layer further comprises forming at least one layer on the first metal layer that comprises a polysilicon layer and/or a second metal layer.

5. The method of claim 4, wherein the first metal layer comprises tantalum nitride (TaN), and the second metal layer comprises tungsten nitride (WN) and/or tungsten (W).

6. The method of claim 1, wherein the charge storage layer comprises a nitride layer.

* * * * *